(12) United States Patent
Onishi

(10) Patent No.: US 8,390,377 B2
(45) Date of Patent: Mar. 5, 2013

(54) DISTORTION COMPENSATING CIRCUIT AND RADIO BASE STATION

(75) Inventor: Masahiko Onishi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 67 days.

(21) Appl. No.: 13/142,204

(22) PCT Filed: Oct. 19, 2009

(86) PCT No.: PCT/JP2009/067974
§ 371 (c)(1),
(2), (4) Date: Jun. 24, 2011

(87) PCT Pub. No.: WO2010/073803
PCT Pub. Date: Jul. 1, 2010

(65) Prior Publication Data
US 2011/0254624 A1    Oct. 20, 2011

(30) Foreign Application Priority Data

Dec. 27, 2008  (JP) .................................. 2008-335561
Dec. 27, 2008  (JP) .................................. 2008-335562

(51) Int. Cl.
*H03F 1/26*    (2006.01)
(52) U.S. Cl. ...................................................... 330/149
(58) Field of Classification Search .................. 330/149; 455/63.1, 114.3
See application file for complete search history.

(56) References Cited

U.S. PATENT DOCUMENTS 7,973,601 B2 *   7/2011   Hamano ....................... 330/149
2005/0009479 A1 *  1/2005  Braithwaite ............... 455/114.3
2008/0186095 A1 *  8/2008  Okazaki ....................... 330/149

FOREIGN PATENT DOCUMENTS

| JP | 2001-268150 | 9/2001 |
| JP | 2001-284980 | 10/2001 |
| JP | 2006-261952 | 9/2006 |

OTHER PUBLICATIONS

Ding, L., "Digital Predistortion of Power Amplifiers for Wireless Applications", Thesis, Mar. 2004, Georgia Institute of Technology.

(Continued)

*Primary Examiner* — Khanh V Nguyen
(74) *Attorney, Agent, or Firm* — McDermott Will & Emery LLP

(57) ABSTRACT

A distortion compensation circuit capable of realizing highly accurate distortion compensation by updating a model even under a situation in which the appearance frequency of an input signal having a maximum value is low. A DPD processor 2 includes an inverse model estimation unit 22, which estimates an inverse model for a model expressing input-output characteristics of an HPA 6 based on an input signal S1 to the HPA 6 and an output signal S10 from the HPA 6, a distortion compensation unit 26, which compensates for distortion of the input-output characteristics by adding the inverse model to the input signal S1, and a sampling circuit 20, which samples the signals S2 and S10 in a predetermined time immediately before the sampling and inputs the signals S2 and S10 to the inverse model estimation unit 22. The inverse model estimation unit 22 updates the inverse model based on S2 and S10 input from the sampling circuit 20 regardless of whether the maximum value that the input signal S1 can take is included in a range sampled by the sampling circuit 20.

18 Claims, 5 Drawing Sheets

OTHER PUBLICATIONS

Kimball, D., et al., "High Efficiency WCDMA Envelope Tracking Base-Station Amplifier Implemented with GaAs HVHBTs", IEEE Transactions of Microwave Theory and Techniques, Nov. 2006, vol. 54 No. 11.

Wang, F., et al., "Design of Wide-Bandwidth Envelope-Tracking Power Amplifiers for OFDM Applications", IEEE Transactions on Microwave Theory and Techniques, Apr. 2005, pp. 1244-1255, vol. 53 No 4, IEEE.

English translation of International Preliminary Report on Patentability issued in International Patent Application No. PCT/JP2009/067974, dated Aug. 16, 2011.

* cited by examiner

DISTORTION COMPENSATING CIRCUIT AND RADIO BASE STATION

RELATED APPLICATIONS

This application is the U.S. National Phase under 35 U.S.C. §371 of International Application No. PCT/JP2009/067974, filed on Oct. 19, 2009, which in turn claims the benefit of Japanese Application No. 2008-335561, filed on Dec. 27, 2008 and Japanese Application No. 2008-335562, filed on Dec. 27, 2008, the disclosures of which Applications are incorporated by reference herein.

TECHNICAL FIELD

The present invention relates to a distortion compensation circuit and a wireless base station including the same.

BACKGROUND ART

In a wireless base station of a communication system using cellular phones or the like, a high power amplifier (HPA), which amplifies and outputs a transmission signal, is arranged in a transmission processor. Generally, an HPA gives priority to amplification efficiency and thus has a low input-output characteristic linearity. That is, in an HPA, the input-output characteristics between an input signal and an output signal are non-linear distortion characteristics. Accordingly, when amplifying an input signal with an HPA having such input-output characteristics, the desired output signal may not be obtained due to distortion. As one distortion compensation method that compensates for such distortion, the following non-patent document 1 proposes a method (so-called digital predistortion: DPD) that compensates for distortion in the input-output characteristics of the amplifier by estimating a model expressing the input-output characteristics of an amplifier, generating an inverse model having characteristics inversed from the model through digital signal processing, and then adding the inverse model to an input signal (digital signal prior to conversion to an analog signal) for the amplifier. Non-patent documents 2 and 3 also propose high-efficiency amplification techniques.

Non-Patent Document 1: Lei Ding, "Digital predistortion of Power Amplifiers for Wireless Applications", Georgia Institute of Technology, March 2004.

Non-Patent Document 2: Donald F. Kimball, et al., "High-Efficiency Envelope-Tracking W-CDMA Base-Station Amplifier Using GaN HFETs", IEEE Transactions on Microwave Theory and Techniques, Vol. 54, NO. 11, November 2006.

Non-Patent Document 3: Feipeng Wang, et al., "Design of Wide-Bandwidth Envelope-Tracking Power Amplifiers for OFDM Applications", IEEE Transactions on Microwave Theory and Techniques, Vol. 53, NO. 4, April 2005.

DISCLOSURE OF THE INVENTION

The input-output characteristics of an HPA vary when the temperature or the like changes. Thus, to realize highly accurate distortion compensation, an inverse model must always be updated to the latest one. To correctly generate an inverse model that covers the entire range of input signals, an input signal, which includes the maximum value (peak value), and the corresponding output signal are necessary. However, an input signal with the maximum value is not always contained in a communication signal and may appear less frequently under a situation in which the amount of communication data is small (during late night hours or the like). Accordingly, when the inverse model is always updated after arrival of an input signal with the maximum value, it becomes difficult to perform distortion compensation with high accuracy because the inverse model is updated less frequently under a situation in which the communication data amount is small. Further, when the model is updated under a situation in which the communication data amount is small, the updated model may not be above to cover the entire range of the input signals. Accordingly, when an input signal is in a range not covered by the updated model and is subsequently input, distortion compensation may not be performed with high accuracy.

Accordingly, it is an object of the present invention to provide a distortion compensation circuit, which is capable of realizing distortion compensation with high accuracy using an inverse model that is adequate even under a situation in which the frequency in which an input signal of the maximum value appears is low, and a wireless base station including the same.

A distortion compensation circuit according to a first aspect of the present invention includes an estimation unit that estimates an inverse model for a model that expresses input-output characteristics of an amplifier based on an input signal, which is input to the amplifier, and an output signal, which is output from the amplifier. A distortion compensation unit compensates for distortion of the input-output characteristics using the inverse model. A sampling unit samples the input signal and the output signal in a predetermined time immediately before the sampling and outputs the input signal and the output signal to the estimation unit. The estimation unit updates the inverse model based on the input signal and the output signal, which are output from the sampling unit, regardless of whether or not a peak value that the input signal can take is included in a range sampled by the sampling unit.

In the distortion compensation circuit of the first aspect, the estimation unit updates the inverse model based on the input signal and the output signal output from the sampling unit regardless of whether or not a peak value that the input signal can take is included in a range sampled by the sampling unit. Accordingly, the estimation unit can update the inverse model even under a situation in which the input signal having the peak value has a low appearance frequency. This allows for the distortion compensation unit to realize highly accurate distortion compensation.

A distortion compensation circuit according to a second aspect of the present invention is characterized in particular by the distortion compensation circuit of the first aspect in that the estimation unit updates the inverse model under the condition that a maximum value of the input signal in the range sampled by the sampling unit is greater than or equal to a predetermined threshold value.

In the distortion compensation circuit of the second aspect, the estimation unit updates the inverse model under the condition that a maximum value of the input signal in the range sampled by the sampling unit is greater than or equal to a predetermined threshold value. Accordingly, when the signal level of the input signal included in the sampled range is less than the predetermined threshold value, the inverse model is not updated. This prevents the range of the input signals covered by the inverse model from becoming too small.

A distortion compensation circuit according to a third aspect of the present invention is characterized in particular by the distortion compensation circuit of the first aspect in that a plurality of threshold values are set in accordance with a maximum value of the input signal in the present inverse model, and the estimation unit updates the inverse model when the maximum value of the input signal in the range sampled by the sampling unit is a value in a present update region determined by the plurality of threshold values.

In the distortion compensation circuit of the third aspect, a plurality of threshold values is set beforehand in accordance with a maximum value of the input signal in the present inverse model. This prevents a range of the input signals covered by the inverse model from becoming suddenly small.

A distortion compensation circuit according to a fourth aspect of the present invention is characterized in particular by the distortion compensation circuit of the first aspect further including a determination unit that determines whether or not to use the inverse model updated by the estimation unit based on a maximum value of the input signal in the range sampled by the sampling unit.

In the distortion compensation circuit according to the fourth aspect, the determination unit determines whether or not to use the inverse model updated by the estimation unit based on a maximum value of the input signal in the sampled range. This allows for selection and use of the proper inverse model at any given time.

A distortion compensation circuit according to a fifth aspect of the present invention is characterized in particular by the distortion compensation circuit of any one of the first to fourth aspects further including a setting unit that sets a predicted maximum value of the input signal based on an average value of the input signal in a given period immediately before start of sampling. When the input signal having at least the predicted maximum value is detected after the sampling unit starts sampling, the sampling unit ends sampling without waiting for the predetermined time to elapse.

In the distortion compensation circuit of the fifth aspect, the setting unit sets a predicted maximum value of the input signal. When the input signal having at least the predicted maximum value is detected after the sampling unit starts sampling, the sampling unit ends sampling. This allows for the sampling period to be shortened and ensures that the input signal having the predicted maximum value is obtained. Thus, the generation of an inverse model that covers the range of the predicted maximum value and less is ensured.

A distortion compensation circuit according to a sixth aspect of the present invention includes an estimation unit that estimates an inverse model for a model that expresses input-output characteristics of an amplifier based on an input signal, which is input to the amplifier, and an output signal, which is output from the amplifier. A distortion compensation unit compensates for distortion of the input-output characteristics using the inverse model. A storage unit stores a plurality of inverse models having different upper limit values of a covered range. When a signal level of the input signal received by the distortion compensation unit is uncovered by one of the inverse models but covered by another one of the inverse models, the distortion compensation unit corrects the input signal received by the distortion compensation unit based on this other one of the inverse models.

In the distortion compensation circuit of the sixth aspect, even when a signal level of an input signal is uncovered by the latest inverse model under a situation in which the input signal having the maximum value has a low appearance frequency, the distortion compensation unit corrects the input signal based on another one of the inverse models stored in the storage unit that covers its signal. Accordingly, even when the inverse model is updated under a situation in which the input signal having the maximum value has the low appearance frequency, distortion compensation having the highest possible accuracy is realized.

A distortion compensation circuit according to a seventh aspect of the present invention is characterized in particular by the distortion compensation circuit of the sixth aspect further including a determination unit that selects one of the inverse models stored in the storage unit. When the signal level of the input signal received by the distortion compensation unit is covered by two or more of the inverse models, the determination unit selects the latest one of the two or more inverse models, and the distortion compensation unit corrects the input signal received by the distortion compensation unit using the latest one of the inverse models.

In the distortion compensation circuit of the seventh aspect, when two or more inverse models are present in the storage unit as inverse models that covers the signal level of an input signal, the distortion compensation unit corrects the input signal based on the latest one of the two inverse models. This realizes highly accurate distortion compensation.

A distortion compensation circuit according to an eighth aspect of the present invention is characterized in particular by the distortion compensation circuit of the seventh aspect in that the estimation unit provides the determination unit with information related to the upper limit values of the covered range for each inverse model. The determination unit selects the latest one of the inverse models based on the information.

In the distortion compensation circuit of the eighth aspect, the latest inverse model may be used up to an upper limit value in its covered range. Thus, highly accurate distortion compensation is realized.

A distortion compensation circuit according to a ninth aspect of the present invention is characterized in particular by the distortion compensation circuit of the seventh aspect in that a plurality of threshold values are set to divide an entire region of a signal level that the input signal received by the distortion compensation unit can take into a plurality of partial regions. The determination unit selects the latest one of the inverse model in units of the partial region based on information related to a maximum one of the threshold values that each of the inverse models covers.

In the distortion compensation circuit of the ninth aspect, there is no need to provide the estimation unit with information related to the upper limit value of the covered range of each model. This allows for reduction in the amount of data transmitted to the estimation unit.

A distortion compensation circuit according to a tenth aspect of the present invention is characterized in particular by the distortion compensation circuit of any one of the sixth to ninth aspects in that when a new inverse model is stored in the storage unit, among the plurality of inverse models stored in the storage unit, an inverse model of which the upper limit value of the covered range is smaller than that of the new inverse model is deleted from the storage unit.

In the distortion compensation circuit of the tenth aspect, obsolete inverse models that have become out-of-date due to the generation of new inverse models are deleted from the storage unit. This prevents a vast amount of data from being stored in the storage unit.

A wireless base station according to an eleventh aspect of the present invention includes an amplifier and a distortion compensation circuit electrically connected to the amplifier. The distortion compensation circuit includes an estimation unit that estimates an inverse model for a model that expresses input-output characteristics of the amplifier based on an input signal, which is input to the amplifier, and an output signal, which is output from the amplifier. A distortion compensation unit compensates for distortion of the input-output characteristics using the inverse model. A sampling unit samples the input signal and the output signal in a predetermined time immediately before the sampling and outputs the input signal and the output signal to the estimation unit. The estimation unit updates the inverse model based on the input signal and the output signal output from the sampling unit regardless of whether or not a peak value that the input signal can take is included in a range sampled by the sampling unit.

In the wireless base station of the eleventh aspect, the distortion compensation circuit properly compensates for distortion of input-output characteristics of the amplifier. Thus, the desired transmission signal can be transmitted from the wireless base station.

A wireless base station according to a twelfth aspect of the present invention includes an amplifier and a distortion compensation circuit electrically connected to the amplifier. The distortion compensation circuit includes an estimation unit that estimates an inverse model for a model that expresses input-output characteristics of the amplifier based on an input signal, which is input to the amplifier, and an output signal, which is output from the amplifier. A distortion compensation unit compensates for distortion of the input-output characteristics using the inverse model. A storage unit stores a plurality of inverse models having different upper limit values of a covered range. When a signal level of the input signal received by the distortion compensation unit is uncovered by one of the inverse models but covered by another one of the inverse models, the distortion compensation unit corrects the input signal received by the distortion compensation unit based on this other one of the inverse models.

In the wireless base station of the twelfth aspect, the distortion compensation circuit properly compensates for distortion of input-output characteristics of the amplifier. Thus, the desired transmission signal can be transmitted from the wireless base station.

The present invention realizes highly accurate distortion compensation even under a situation in which an input signal with a maximum value has a low appearance frequency.

DETAILED DESCRIPTION OF THE EMBODIMENTS

Figure 1:
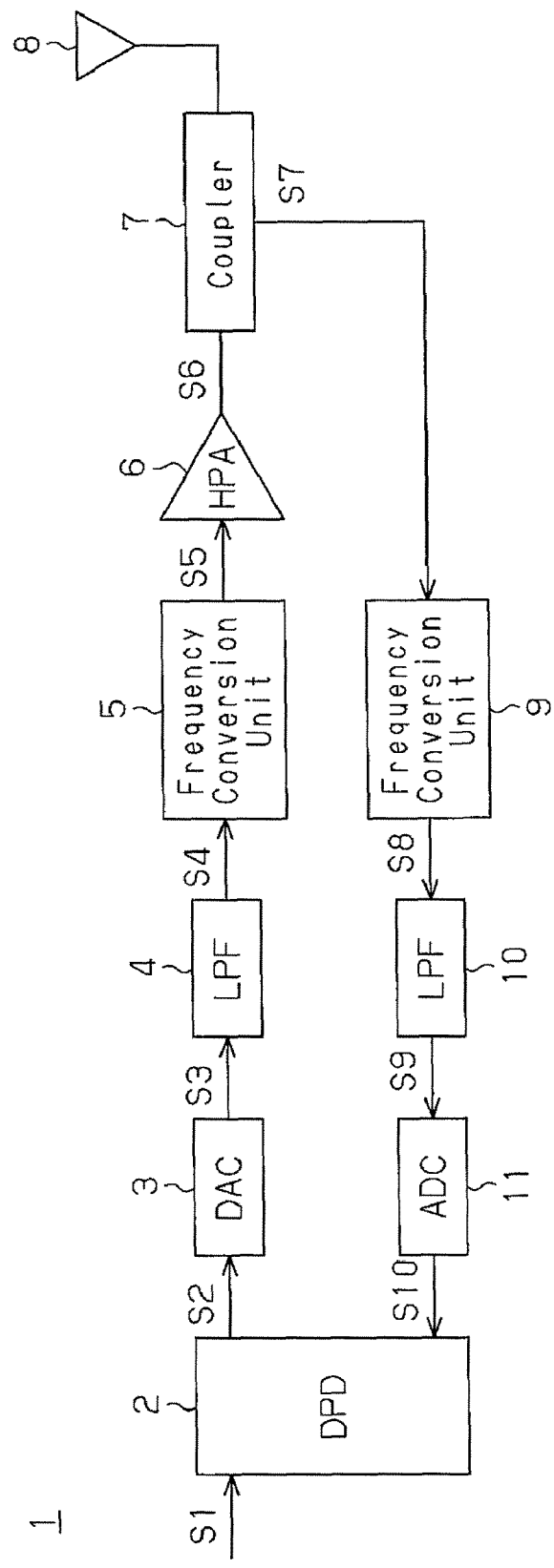
FIG. 1 is a block diagram showing part of a wireless base station according to one embodiment of the present invention.

One embodiment of the present invention will now be described in detail with reference to the drawings. Like or same reference numerals are given to those components that are the same as the corresponding components throughout the drawings.

FIG. 1 is a block diagram showing part of a wireless base station 1 according to one embodiment of the present invention. As shown by the connection relation in FIG. 1, the wireless base station 1 includes a digital predistortion (DPD) processor 2, a digital-to-analog converter (DAC) 3, a low pass filter (LPF) 4, a frequency conversion unit 5, a high power amplifier (HPA) 6, a coupler 7, an antenna 8, a frequency conversion unit 9, an LPF 10, and an analog-to-digital converter (ADC) 11.

The DPD processor 2 corrects an input signal S1, which is a digital signal, to output a signal S2. The contents of the correction performed by the DPD processor 2 will be described later. The DAC 3 converts the signal S2, which is a digital signal, into an analog signal S3 and outputs the analog signal S3. The LPF 4 performs low pass filter processing on the signal S3 to output a signal S4. The frequency conversion unit 5 converts the frequency of the baseband signal S4 into a radio-frequency signal S5 and outputs the signal S5. The HPA 6 amplifies the signal S5 to output a signal S6. The signal S6 is transmitted from the antenna 8.

Part of the signal S6 from the HPA 6 to the antenna 8 is retrieved by the coupler 7 as a signal S7. The frequency conversion unit 9 converts the frequency of the radio-frequency signal S7 into a baseband signal S8 and outputs the baseband signal S8. The LPF 10 performs low pass filter processing on the signal S3 to output a signal S9. The ADC 11 converts the analog signal S9 into a digital signal S10 and outputs the signal S10. The signal S10 is input to the DPD processor 2.

Figure 2:
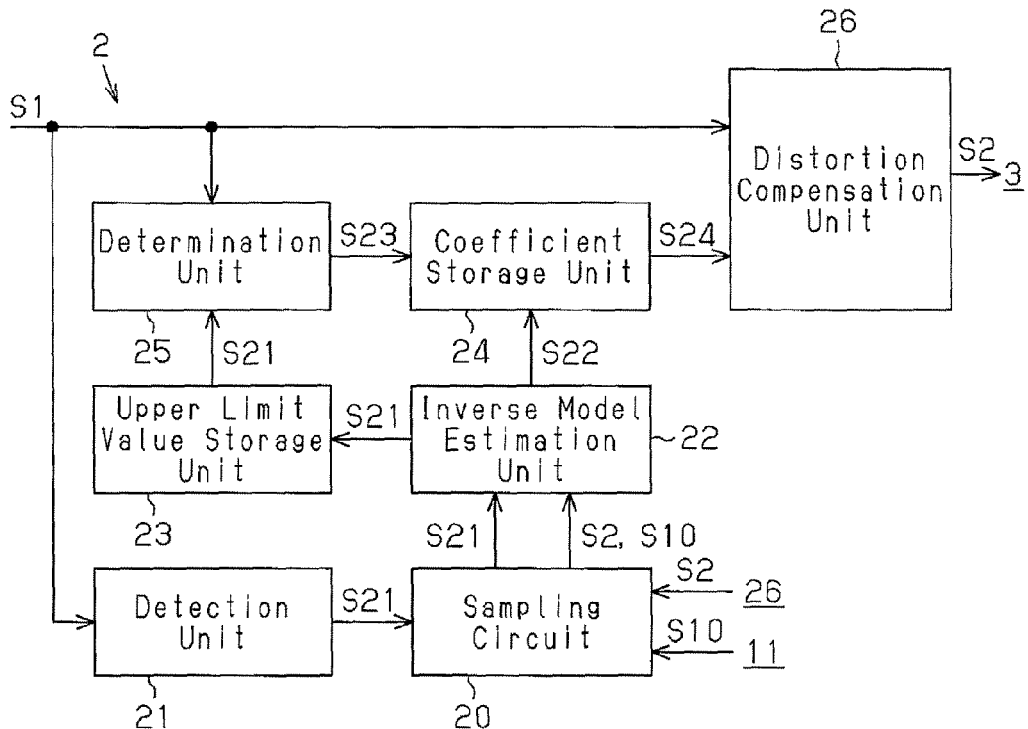
FIG. 2 is a block diagram showing a first example of a DPD processor.

FIG. 2 is a block diagram showing a first example of the DPD processor 2. As shown by the connection relation in FIG. 2, the DPD processor 2 includes a sampling circuit 20, a detection unit 21, an inverse model estimation unit 22, an upper limit value storage unit 23, a coefficient storage unit 24, a determination unit 25, and a distortion compensation unit 26.

The sampling circuit 20 receives the signal S2 from the distortion compensation unit 26 and the signal S10 from the ADC 11. The sampling circuit 20 samples the signals S2 and S10 in a predetermined time immediately before the sampling (hereinafter referred to as "sampling time") and inputs the signals S2 and S10 to the inverse model estimation unit 22. The inverse model estimation unit 22 estimates a model expressing input-output characteristics of the HPA 6 based on the signals S2 and S10 and computes coefficients of each order (i.e., coefficient set of an inverse model) to express an inverse model of the estimated model in the form of a polynomial of an nth-order power (in which n is a natural number). To compensate for non-linear distortion in a model, the distortion characteristics of the model are inverted in an inverse model.

Further, the detection unit 21 detects a maximum level (maximum power value, for example) of the input signal S1 in the sampling time and sends data S21, which is related to the maximum power value, to the sampling circuit 20. The data S21 is input from the sampling circuit 20 to the inverse model estimation unit 22 and associated with the inverse model coefficient, which is obtained as described above. The maximum power value provided by the data S21 indicates an upper limit value for range covered by the associated inverse model.

Data S22 related to the coefficient set of the inverse model is input from the inverse model estimation unit 22 to the coefficient storage unit 24 and stored in the coefficient storage unit 24. In other words, the inverse model is stored in the coefficient storage unit 24. Further, the data S21 related to the maximum power value associated with the inverse model is input from the inverse model estimation unit 22 to the upper limit value storage unit 23 and stored in the upper limit value storage unit 23.

The distortion compensation unit 26 receives the input signal S1 and data S24 related to the coefficient set from the coefficient storage unit 24. The distortion compensation unit 26 corrects the input signal S1 based on the coefficient set (inverse model) provided by the data S24. This outputs the signal S2, which is obtained by performing proper distortion compensation on the input signal S1, from the distortion compensation unit 26.

The input-output characteristics of the HPA 6 vary as the temperature or the like changes. Thus, in order to realize highly accurate distortion compensation, the inverse model estimation unit 22 must always update the model and inverse model to the latest ones.

Figure 3:
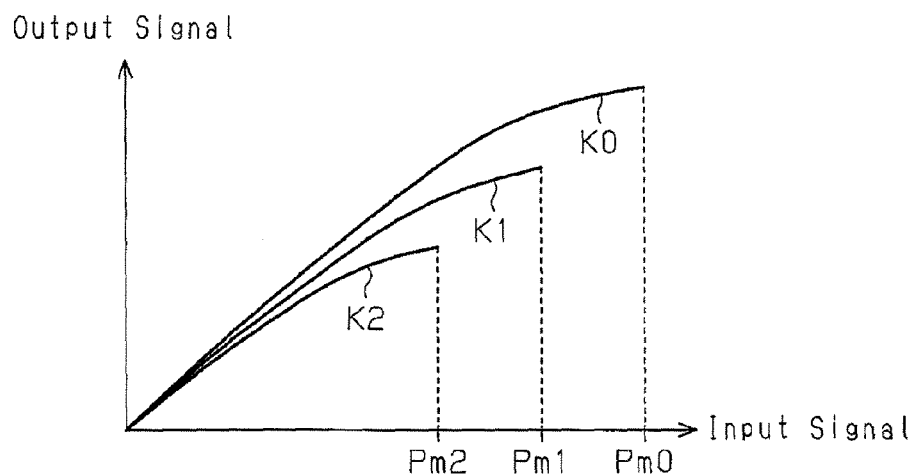
FIG. 3 is a graph showing one example of a plurality of models updated in sequence.

FIG. 3 is a graph showing one example of a plurality of models K0 to K2 updated in sequence. The horizontal axis indicates a signal level (for example, power value) of the input signal S1 and the vertical axis indicates the signal level (for example, power value) of the output signal (signal S10). The model K0 is estimated by the inverse model estimation unit 22 under a situation in which the amount of communication data is large, and an upper limit value Pm0 of the covered range conforms to a maximum value (peak value) that the signal level of the input signal S1 can take. Accordingly, by using the model K0, the inverse model estimation unit 22 can generates an inverse model that covers the entire range of the input signal S1. The data S21 indicating the upper limit value Pm0 is associated with the inverse model of the model K0 and stored in the upper limit value storage unit 23.

A model K1 obtained by updating the model K0 is estimated by the inverse model estimation unit 22 under a situation in which the amount of communication data is relatively small, and an upper limit value Pm1 of the covered range of the model K1 is smaller than the maximum value Pm0 of the model K0. Accordingly, when an inverse model generated from the model K1 is used, the distortion compensation unit 26 may not perform distortion compensation on the input signal S1 that has a signal level in excess of the upper limit value Pm1. However, in a range that is less than or equal to the upper limit value Pm1, the input-output characteristics that are newer than the model K0 can be expressed by the model K1. Thus, highly accurate distortion compensation can be realized. The data S21 indicating the upper limit value Pm1 is associated with the inverse model of the model K1 and stored in the upper limit value storage unit 23.

The model K2 obtained by updating the model K1 is estimated by the inverse model estimation unit 22 under a situation in which the amount of communication data is further smaller, and an upper limit value Pm2 of the covered range of the model K2 is smaller than the maximum value Pm1 of the model K1. Accordingly, when an inverse model generated from the model K2 is used, the distortion compensation unit 26 may not perform distortion compensation on the input signal S1 having a signal level in excess of the upper limit value Pm2. However, in a range that is less than or equal to the upper limit value Pm2, the model K2 expresses the input-output characteristics that are newer than the models K0 and K1. Thus, highly accurate distortion compensation is realized. The data S21 indicating the upper limit value Pm2 is associated with the inverse model of the model K2 and stored in the upper limit value storage unit 23.

In the DPD processor 2 of the present embodiment, the coefficient sets of each of the inverse models corresponding to the models K0 to K2 are stored in the coefficient storage unit 24. The distortion compensation unit 26 performs distortion compensation on the input signal S1 by selecting the optimal one of the three inverse models corresponding to the respective models K0 to K2. This will now be described in detail.

Figure 4:
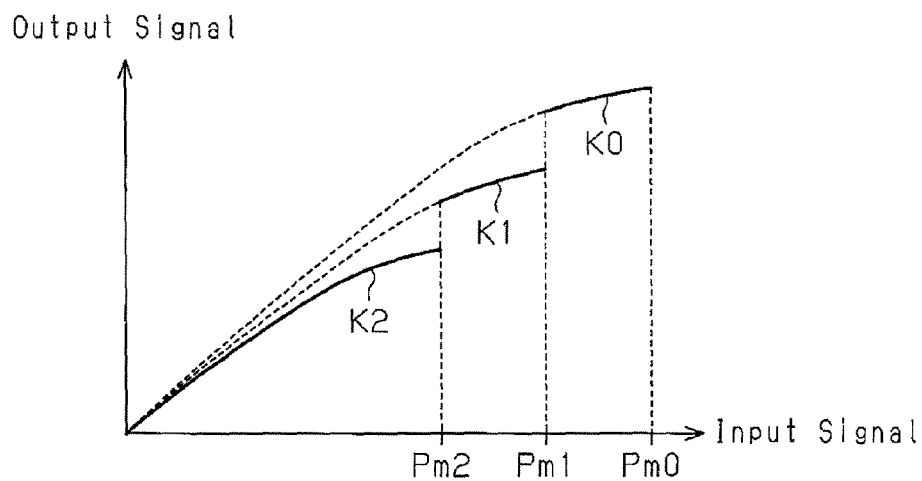
FIG. 4 is a graph for the selection of an inverse model by a distortion compensation unit.

FIG. 4 is a graph for the selection of the inverse model by the distortion compensation unit 26. The input signal S1 is input to the distortion compensation unit 26 and the determination unit 25. Further, the determination unit 25 receives the data S21 related to the upper limit value of the covered range of each inverse model from the upper limit value storage unit 23. When the signal level of the input signal S1 is less than or equal to the upper limit value Pm2, the determination unit 25 selects the inverse model corresponding to the model K2. That is, when the signal level of the input signal S1 is less than or equal to the upper limit value Pm2, the three inverse models corresponding to the respective models K0 K2 are present as the inverse model that covers the signal level. In this case, the determination unit 25 selects the latest one (the inverse model corresponding to the model K2) of the three inverse models. Data S23 related to the selection of the inverse model is input to the coefficient storage unit 24 from the determination unit 25. Then, the data S24 related to the coefficient set of the selected inverse model is input from the coefficient storage unit 24 to the distortion compensation unit 26. The distortion compensation unit 26 corrects the input signal S1 based on the inverse model having the coefficient set obtained by the data S24.

In the same manner, when the signal level of the input signal S1 is greater than the upper limit value Pm2 and less than or equal to the upper limit value Pm1, the determination unit 25 selects the inverse model corresponding to the model K1. That is, when the signal level of the input signal S1 is greater than the upper limit value Pm2 and less than or equal to the upper limit value Pm1, the two inverse models corresponding to the respective models K0 and K1 are present as the inverse model that covers that signal level. In this case, the determination unit 25 selects the latest one (the inverse model corresponding to the model K1) of the two inverse models so that the distortion compensation unit 26 corrects the input signal S1 based on the selected inverse model.

Further, when the signal level of the input signal S1 is greater than the upper limit value Pm1, only the inverse model corresponding to the model K0 is present as the inverse model that covers the signal level. In this case, the determination unit 25 selects the inverse model corresponding to the model K0, and the distortion compensation unit 26 corrects the input signal S1 based on the selected inverse model.

In the foregoing description illustrates an example in which models are updated in a descending order in which the upper limit value becomes smaller (models K0→K1→K2). In contrast, if the models are updated in the order of K1→K0→K2), when the inverse model corresponding to the model K0 is stored in the coefficient storage unit 24, the inverse model corresponding to the model K1 may be deleted from the coefficient storage unit 24. In this case, the determination unit 25 selects the inverse model corresponding to the model K2 when the signal level of the input signal S1 is less than or equal to the upper limit value Pm2, and the determination unit 25 selects the inverse model corresponding to the model K0 when the signal level of the input signal S1 is greater than the upper limit value Pm2.

Figure 5:
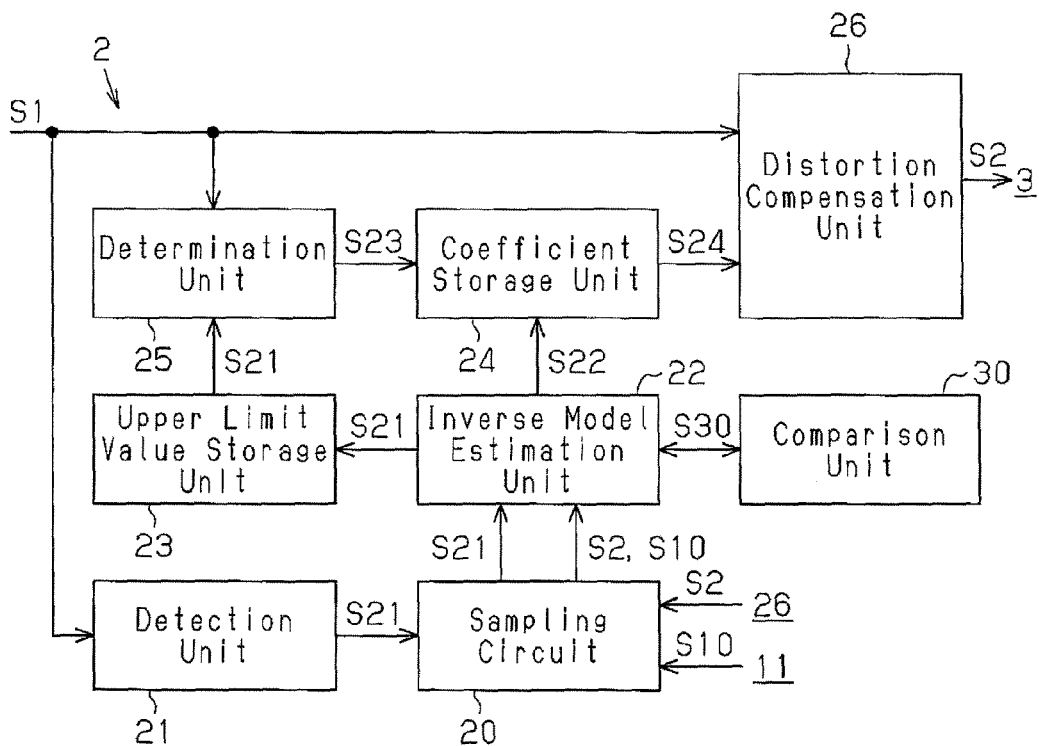
FIG. 5 is a block diagram showing a second example of the DPD processor.

FIG. 5 is a block diagram showing a second example of the DPD processor 2. This configuration is the same as that shown in FIG. 2 except in that a comparison unit 30 is added.

Figure 6:
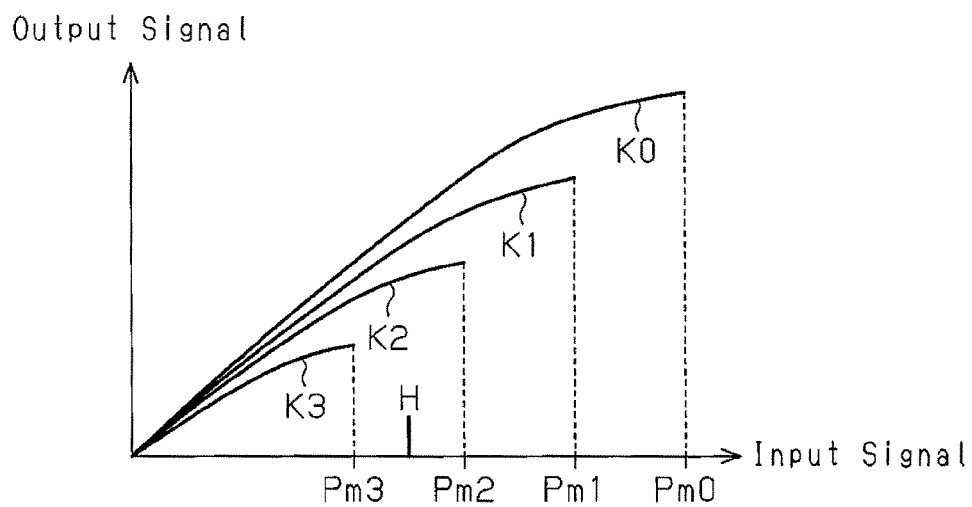
FIG. 6 is a graph showing one example of a plurality of models in correspondence with FIG. 3.

FIG. 6 is a graph showing one example of the plurality of models K0-K3 corresponding to FIG. 3. A predetermined threshold value H is set for the signal level of the input signal S1. The threshold value H is set, for example, to a value that is one half of the maximum value (peak value) that the input signal S1 can take. However, the threshold value H may be set to any other value. The set value of the threshold value H is taught beforehand to the comparison unit 30.

When the inverse model estimation unit 22 estimates an inverse model, the comparison unit 30 compares the maximum value of the input signal S1 (i.e., an upper limit value obtained from the data S21) in a range in which the sampling circuit 20 performs sampling with the threshold value H. Then, results of the comparison are input as data S30 to the inverse model estimation unit 22. The inverse model estimation unit 22 updates the inverse model when determined that the maximum value of the input signal S1 in the sampling range is greater than or equal to the threshold value H based on the data S30. In contrast, when the maximum value of the input signal S1 in the sampling range is less than the threshold value H, the inverse model is not updated. In the example shown in FIG. 6, the inverse models corresponding to the models K0, K1, and K2 are updated. However, the inverse model corresponding to the model K2 is not updated to the inverse model corresponding to the model K3 because the upper limit value (i.e., the maximum value of the input signal S1 in the sampling range when estimating the model K3) of the covered range of the model K3 is less than the threshold value H.

Figure 7:
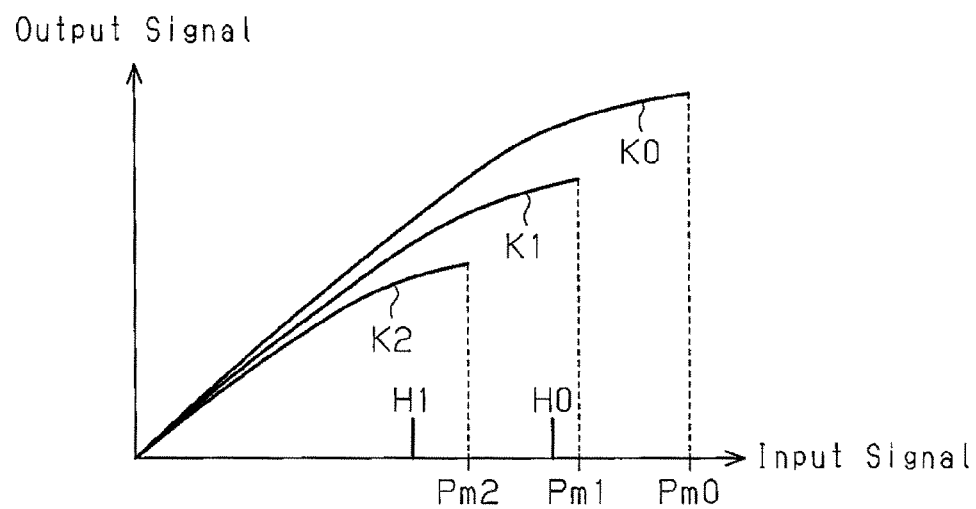
FIG. 7 is a graph showing another example of a plurality of models in correspondence with FIG. 3.

FIG. 7 is a graph showing another example of the plurality of models K0-K2 corresponding to FIG. 3. A plurality of predetermined threshold values H0 and H1 are set for the signal level of the input signal S1. The threshold value H1 is set to, for example, one half of the maximum value (peak value) that the input signal S1 can take. The threshold value H0 is set to, for example, an intermediate value between the peak value and the threshold value H1. However, the threshold values H0 and H1 may be set to other values. Further, the number of the threshold values is not limited to two but may be three or more (for example, four). The set values of the threshold values H0 and H1 are taught beforehand to the comparison unit 30.

When the inverse model estimation unit 22 estimates an inverse model, the comparison unit 30 compares the maximum value of the input signal S1 in the sampling range with the threshold values H0 and H1. Then, the results of the comparison are input as the data S30 to the inverse model estimation unit 22.

When updating the inverse model corresponding to the model K0 including the peak value to an inverse model having an upper limit value of a smaller covered range, the inverse model estimation unit 22 performs updating under the condition that the upper limit value of the updated inverse model is a value in the presently set update range, in this case, the threshold value H0. That is, when the upper limit value of the updated inverse model is the threshold value H0 or larger, updating is performed based on the data S30. When the upper limit value is less than the threshold value H0, updating is not performed. In the example shown in FIG. 7, the upper limit value Pm1 of the model K1 is greater than or equal to the threshold value H0. Thus, the inverse model corresponding to the model K0 is updated to the inverse model corresponding to the model K1. However, the upper limit value Pm2 of the model K2 is less than the threshold value H0. Thus, the inverse model corresponding to the model K0 is not directly updated to the inverse model corresponding to the model K2. In the example shown in FIG. 7, instead of the data S21 indicating the upper limit value Pm0, flag information indicating that the signals S2 and S10 cover the peak value is input from the sampling circuit 20 to the inverse model estimation unit 22 in association with the signals S2 and S10. In the same manner, in the example shown in FIG. 7, instead of the data S21 indicating the upper limit value Pm1, flag information indicating that the signals S2 and S10 cover the threshold value H0 is input from the sampling circuit 20 to the inverse model estimation unit 22 in association with the signals S2 and S10.

When the inverse model estimation unit 22 updates the inverse model corresponding to the model K1, of which upper limit value is greater than or equal to the threshold value H0, to an inverse model having a covered range with a smaller upper limit value, the inverse model estimation unit 22 performs updating under the condition that the upper limit value of the updated inverse model is greater than or equal to a value in the presently set update range, in this case, the threshold value H1. That is, when the upper limit value of the updated inverse model is greater than or equal to the threshold value H1, the inverse model estimation unit 22 performs updating based on the data S30. When the upper limit value is less than the threshold value H1, the inverse model estimation unit 22 does not perform updating. In the example shown in FIG. 7, the upper limit value Pm2 of the model K2 is greater than or equal to the threshold value H1. Thus, the inverse model corresponding to the model K1 is updated to the inverse model corresponding to the model K2. In the same manner as described above, in the example shown in FIG. 7, instead of the data S21 indicating the upper limit value Pm2, flag information indicating that the signals S2 and S10 cover the threshold value H1 is associated with the signals S2 and S10 and input from the sampling circuit 20 to the inverse model estimation unit 22.

Figure 8:
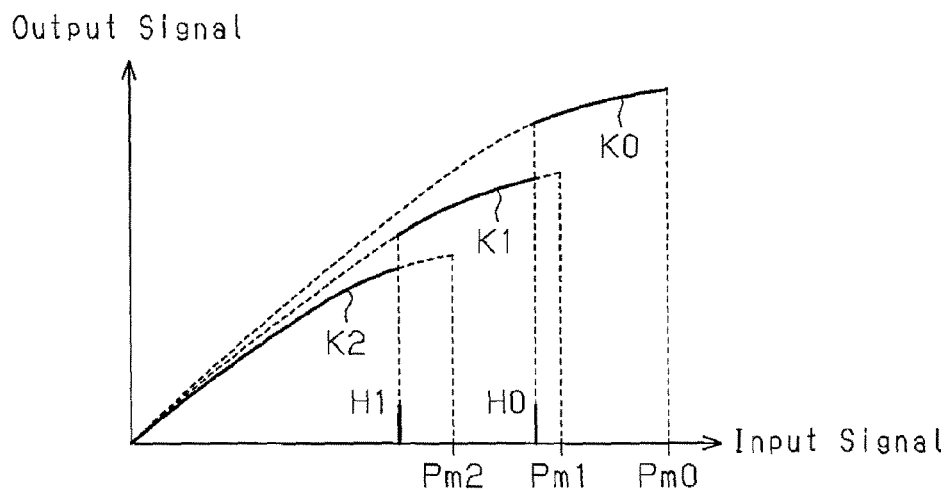
FIG. 8 is a graph for the selection of an inverse model by the distortion compensation unit in correspondence with FIG. 7.

FIG. 8 is a graph corresponding to FIG. 7 and used by the coefficient storage unit 24 to select an inverse model. The threshold values H0 and H1, which are set in the comparison unit 30, are stored also in the upper limit value storage unit 23. When the signal level of the input signal S1 is less than or equal to the threshold value H1, the determination unit 25 generates the data S23 related to the selection of an inverse model that corresponds to the portion of the latest model K2 in this range that is less than or equal to the threshold value H1. The distortion compensation unit 26 corrects the input signal S1 based on the coefficient set of an inverse model selected in the coefficient storage unit 24 in accordance with the data S23. Further, when the signal level of the input signal S1 is greater than the threshold value H1 and less than or equal to the threshold value H0, the distortion compensation unit 26 corrects the input signal S1 based on an inverse model that corresponds to the portion of the latest model K1 in this range that is greater than the threshold value H1 and less than or equal to the threshold value H0. Further, when the signal level of the input signal S1 is greater than the threshold value H0, the distortion compensation unit 26 corrects the input signal S1 based on an inverse model that corresponds to the portion of the latest model K0 in this range that is greater than the threshold value H0. In this manner, the entire signal level region over which the input signal S1 can take is divided into a plurality of regions by at least two threshold values. For example, when the present inverse model is K0 as shown in FIG. 8, a power value range of 0 (zero) to Pm0 for the input signal S1 is divided into three regions (0 to H1, H1 to H0, and H0 to Pm0) by the two threshold values H0 and H1. Then, the determination unit 25 selects one of the inverse models (the latest one when there are two or more inverse models) in each of the partial regions.

Figure 9:
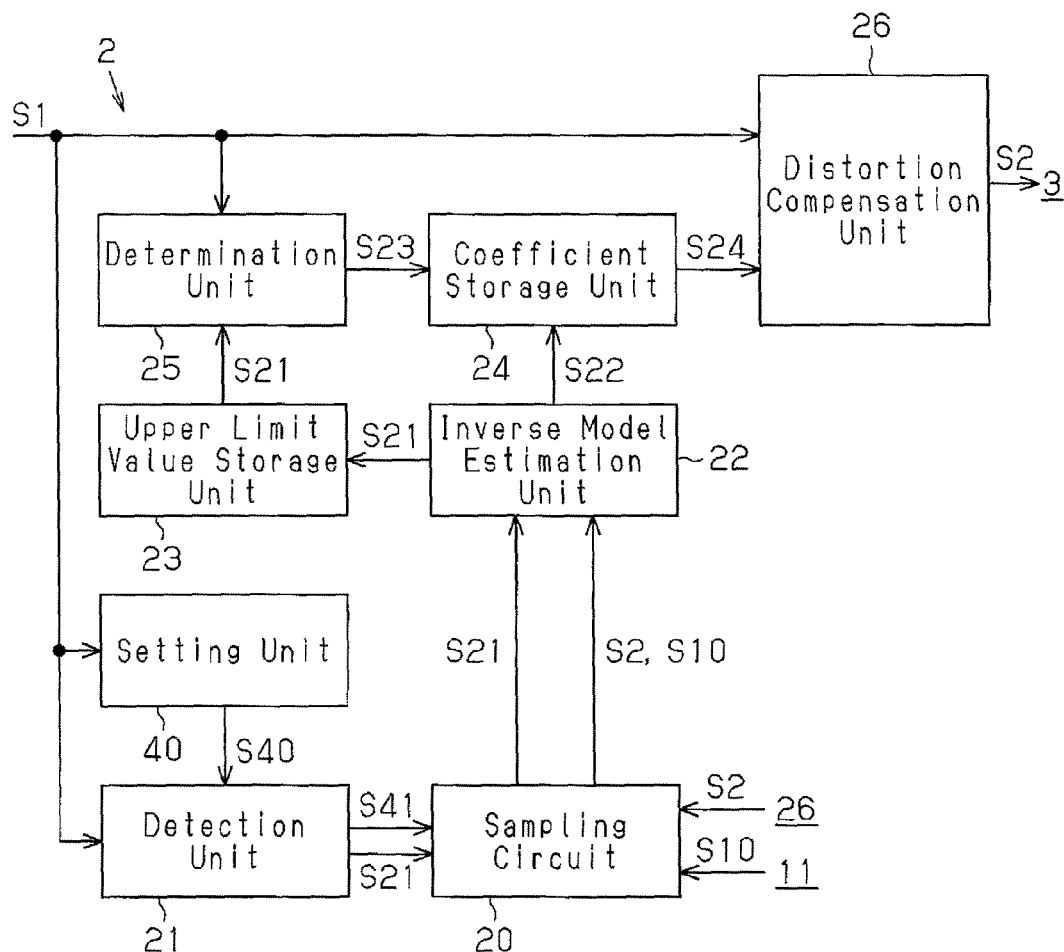
FIG. 9 is a block diagram showing a third example of the DPD processor.

FIG. 9 is a block diagram showing a third example of the DPD processor 2. This configuration is the same as that shown in FIG. 2 except in that a setting unit 40 is added.

The setting unit 40 obtains an average value of the signal level (for example, power value) of the input signal S1 in a given period immediately before start of sampling circuit 20 starts sampling. Further, the setting unit 40 sets a value that is higher than the average value by a predetermined level (10-11 dBm, for example) as a predicted maximum value of the input signal S1. The upper limit of the predicted maximum value is assumed to be a maximum value (peak value) that the input signal S1 can take. Data S40 related to the predicted maximum value is input from the setting unit 40 to the detection unit 21.

When the sampling circuit 20 starts sampling, the detection unit 21 consecutively monitors the signal level of the sampled input signal S1. Then, when detecting the input signal S1 having at least the predicted maximum value obtained from the data S40, the detection unit 21 provides the sampling circuit 20 with data S41 indicating such state. When received the data S41, the sampling circuit 20 immediately ends sampling. When the input signal S1 having at least the predicted maximum value obtained from the data S40 is not detected by the detection unit 21, the sampling circuit 20 ends sampling after the predetermined time elapses from when the sampling starts.

In this manner, in the DPD processor 2 (distortion compensation circuit) of the present embodiment, the inverse model estimation unit 22 updates an inverse model based on the signals S2 and S10 received from the sampling circuit 20 regardless of whether or not the maximum value (peak value) that the input signal S1 can take is included in the range sampled by the sampling circuit 20. Thus, the inverse model estimation unit 22 can update the model even under a situation in which the appearance frequency of the input signal S1 having the maximum value (peak value) is low. Further, the inverse model is updated accordingly. This allows for highly accurate distortion compensation to be realized in the distortion compensation unit 26.

In the DPD processor 2 shown in FIGS. 5 and 6, the inverse model estimation unit 22 updates an inverse model under the condition that the maximum value of the input signal S1 in the range sampled by the sampling circuit 20 is greater than or equal to the predetermined value H. Accordingly, when the signal level of the input signal S1 in the sampled range is less than the threshold value H, the inverse model is not updated. This prevents the range of the input signal S1 covered by the inverse model from becoming too small. The threshold value may be fixed or variable.

In the DPD processor 2 shown in FIG. 7, the plurality of threshold values H0 and H1 are set in accordance with an upper limit value of the input signal S1 in the present inverse model. In other words, the threshold values H0 and H1 are always varied in accordance with the maximum value (peak value) of the input signal S1. For example, in FIG. 7, when the present inverse model is model K1, the threshold value H1 is set to one half of the maximum value Pm1, and the threshold value H0 is set to an intermediate value between the maximum value Pm1 and the threshold value H1 (one half of the maximum value Pm1). In this state, when the inverse model is updated from model K1 to model K0, the threshold value H1 is changed to one half of the maximum value Pm0, and the threshold value H0 is changed to the intermediate value between the maximum value Pm0 and the threshold value H1 (one half of the maximum value Pm0). Accordingly, the use of the threshold values H0 and H1 prevents the range of the input signal S1 covered by the inverse model from suddenly becoming small. For example, the inverse model corresponding to the model K0 can be avoided from being directly updated to the inverse model corresponding to the model K2.

In the DPD processor 2 shown in FIG. 9, the setting unit 40 sets a predicted maximum value for the input signal S1. After the sampling circuit 20 starts sampling, when the input signal S1 of the predicted maximum value or greater is detected, the sampling circuit 20 ends sampling. This shortens the sampling period and ensures that the input signal S1 having the predicted maximum value is obtained. Thus, the generation of an inverse model that covers a range of the predicted maximum value or less is ensured.

Further, in the wireless base station 1 of the present embodiment, distortion of the input-output characteristics of the HPA 6 is properly compensated by the DPD processor 2. This allows for the desired transmission signal to be transmitted from the wireless base station 1.

The disclosed embodiments are exemplary in all respects and not restrictive. The present is not to be limited to the details given herein, but may be modified within the scope and equivalence of the appended claims.

The invention claimed is:

1. A distortion compensation circuit comprising:
an estimation unit that estimates an inverse model for a model that expresses input-output characteristics of an amplifier based on an input signal, which is input to the amplifier, and an output signal, which is output from the amplifier;
a distortion compensation unit that compensates for distortion of the input-output characteristics using the inverse model; and
a sampling unit that samples the input signal and the output signal in a predetermined time immediately before the sampling and outputs the input signal and the output signal to the estimation unit;
wherein the estimation unit updates the inverse model based on the input signal and the output signal, which are output from the sampling unit, regardless of whether or not a peak value that the input signal can take is included in a range sampled by the sampling unit.

2. The distortion compensation circuit according to claim 1, wherein the estimation unit updates the inverse model under the condition that a maximum value of the input signal in the range sampled by the sampling unit is greater than or equal to a predetermined threshold value.

3. The distortion compensation circuit according to claim 1, wherein a plurality of threshold values are set in accordance with a maximum value of the input signal in a present inverse model, and the estimation unit updates the inverse model when the maximum value of the input signal in the range sampled by the sampling unit is a value in a present update region determined by the plurality of threshold values.

4. The distortion compensation circuit according to claim 1, further comprising a determination unit that determines whether or not to use the inverse model updated by the estimation unit based on a maximum value of the input signal in the range sampled by the sampling unit.

5. The distortion compensation circuit according to claim 1, further comprising a setting unit that sets a predicted maximum value for the input signal based on an average value of the input signal in a given period immediately before start of sampling,
wherein when the input signal having at least the predicted maximum value is detected after the sampling unit starts sampling, the sampling unit ends sampling without waiting for the predetermined time to elapse.

6. The distortion compensation circuit according to claim 2, further comprising a setting unit that sets a predicted maximum value for the input signal based on an average value of the input signal in a given period immediately before start of sampling,
wherein when the input signal having at least the predicted maximum value is detected after the sampling unit starts sampling, the sampling unit ends sampling without waiting for the predetermined time to elapse.

7. The distortion compensation circuit according to claim 3, further comprising a setting unit that sets a predicted maximum value for the input signal based on an average value of the input signal in a given period immediately before start of sampling,
wherein when the input signal having at least the predicted maximum value is detected after the sampling unit starts sampling, the sampling unit ends sampling without waiting for the predetermined time to elapse.

8. The distortion compensation circuit according to claim 4, further comprising a setting unit that sets a predicted maximum value for the input signal based on an average value of the input signal in a given period immediately before start of sampling,
wherein when the input signal having at least the predicted maximum value is detected after the sampling unit starts sampling, the sampling unit ends sampling without waiting for the predetermined time to elapse.

9. A distortion compensation circuit comprising:
an estimation unit that estimates an inverse model for a model that expresses input-output characteristics of an amplifier based on an input signal, which is input to the amplifier, and an output signal, which is output from the amplifier;
a distortion compensation unit that compensates for distortion of the input-output characteristics using the inverse model; and
a storage unit that stores a plurality of inverse models having different upper limit values of a covered range;
wherein when a signal level of the input signal received by the distortion compensation unit is uncovered by one of the inverse models but covered by another one of the inverse models, the distortion compensation unit corrects the input signal received by the distortion compensation unit based on the another one of the inverse models.

10. The distortion compensation circuit according to claim 9, further comprising a determination unit that selects one of the inverse models stored in the storage unit,
wherein when the signal level of the input signal received by the distortion compensation unit is covered by two or more of the inverse models, the determination unit selects the latest one of the two or more inverse models, and the distortion compensation unit corrects the input signal received by the distortion compensation unit using the latest one of the inverse models.

11. The distortion compensation circuit according to claim 10, wherein the estimation unit provides the determination unit with information related to the upper limit values of the covered range for each inverse model,
wherein the determination unit selects the latest one of the inverse models based on the information.

12. The distortion compensation circuit according to claim 10, wherein
a plurality of threshold values are set to divide an entire region of a signal level that the input signal received by the distortion compensation unit can take into a plurality of partial regions, and
the determination unit selects the latest one of the inverse model in one of the partial regions based on information related to a maximum one of the threshold values that each of the inverse models covers.

13. The distortion compensation circuit according to claim 9, wherein when a new inverse model is stored in the storage unit, among the plurality of inverse models stored in the storage unit, an inverse model of which the upper limit value of the covered range is smaller than that of the new inverse model is deleted from the storage unit.

14. The distortion compensation circuit according to claim 10, wherein when a new inverse model is stored in the storage unit, among the plurality of inverse models stored in the storage unit, an inverse model of which the upper limit value of the covered range is smaller than that of the new inverse model is deleted from the storage unit.

15. The distortion compensation circuit according to claim 11, wherein when a new inverse model is stored in the storage unit, among the plurality of inverse models stored in the storage unit, an inverse model of which the upper limit value of the covered range is smaller than that of the new inverse model is deleted from the storage unit.

16. The distortion compensation circuit according to claim 12, wherein when a new inverse model is stored in the storage unit, among the plurality of inverse models stored in the storage unit, an inverse model of which the upper limit value of the covered range is smaller than that of the new inverse model is deleted from the storage unit.

17. A wireless base station comprising:
an amplifier; and
a distortion compensation circuit electrically connected to the amplifier, wherein the distortion compensation circuit includes:
an estimation unit that estimates an inverse model for a model that expresses input-output characteristics of the amplifier based on an input signal, which is input to the amplifier, and an output signal, which is output from the amplifier;
a distortion compensation unit that compensates for distortion of the input-output characteristics using the inverse model; and
a sampling unit that samples the input signal and the output signal in a predetermined time immediately before the sampling and outputs the input signal and the output signal to the estimation unit;
wherein the estimation unit updates the inverse model based on the input signal and the output signal output from the sampling unit regardless of whether or not a peak value that the input signal can take is included in a range sampled by the sampling unit.

18. A wireless base station comprising:
an amplifier; and
a distortion compensation circuit electrically connected to the amplifier, wherein the distortion compensation circuit includes:
an estimation unit that estimates an inverse model for a model that expresses input-output characteristics of the amplifier based on an input signal, which is input to the amplifier, and an output signal, which is output from the amplifier;
a distortion compensation unit that compensates for distortion of the input-output characteristics using the inverse model; and
a storage unit that stores a plurality of inverse models having different upper limit values of a covered range;
wherein when a signal level of the input signal received by the distortion compensation unit is uncovered by one of the inverse models but covered by another one of the inverse models, the distortion compensation unit corrects the input signal received by the distortion compensation unit based on the another one of the inverse models.

* * * * *